United States Patent [19]

Miwa et al.

[11] Patent Number: 4,635,086
[45] Date of Patent: Jan. 6, 1987

[54] SELF TURNOFF TYPE SEMICONDUCTOR SWITCHING DEVICE

[75] Inventors: Junichi Miwa; Minoru Kato, both of Yokohama, Japan

[73] Assignee: Kabushiki Kaisha Toshiba, Kawasaki, Japan

[21] Appl. No.: 706,615

[22] Filed: Feb. 28, 1985

[30] Foreign Application Priority Data

Oct. 8, 1984 [JP] Japan ................... 59-209767

[51] Int. Cl.$^4$ ........................................... H01L 29/74
[52] U.S. Cl. ........................... 357/38; 357/23.4; 357/15; 357/43; 357/86; 307/252 A
[58] Field of Search ............. 357/15, 38, 38 G, 38 T, 357/43, 23.4, 86; 307/252 A

[56] References Cited

U.S. PATENT DOCUMENTS

| 3,489,962 | 1/1970 | McIntyre et al. | 357/38 |
| 3,831,187 | 8/1974 | Neilson | 357/23.4 |
| 4,054,893 | 10/1977 | Hutson | 357/38 |
| 4,509,068 | 4/1985 | Stoisiek | 307/252 A |

FOREIGN PATENT DOCUMENTS

| 2835076 | 3/1980 | Fed. Rep. of Germany | 357/38 T |
| 3118347 | 11/1982 | Fed. Rep. of Germany | 357/38 T |
| 2070330 | 9/1981 | United Kingdom | 357/38 T |

Primary Examiner—Joseph E. Clawson, Jr.
Attorney, Agent, or Firm—Finnegan, Henderson, Farabow, Garrett & Dunner

[57] ABSTRACT

A semiconductor switching device includes first to fourth layers, a first gate portion, a second gate portion and a common gate terminal interconnecting the first and second gate portions. The first gate portion is the current control type and has a rectifying PN junction, and the second gate portion is the voltage control type. When a first polarity vias voltage is applied to the common gate terminal, the device turns on through the second gate portion, while turns off through the first gate portion when a second polarity vias voltage is applied to the terminal.

4 Claims, 8 Drawing Figures

SELF TURNOFF TYPE SEMICONDUCTOR SWITCHING DEVICE

BACKGROUND OF THE INVENTION

The present invention relates to a semiconductor switching device with a self turnoff function.

A conventional gate turnoff thyristor (GTO) and an insulating gate transistor will be used for description of the switching device with a self turnoff function.

In FIG. 1, there is shown a structure of the GTO as a first example of the conventional switching device. As shown, the GTO has a PNPN structure in which a P type anode emitter P1, an N type base N1, a P type base P2, and an N type cathode emitter N2 are successively multilayered. An anode electrode A is connected to the anode emitter P1 through an ohmic contact. Between a cathode electrode K and the cathode emitter N2 and a gate electrode G and the base P2 are also formed ohmic contacts. In operation of the switching device thus structured, a plus voltage is applied to the anode electrode A, and a minus voltage, to the cathode electrode K. Under this condition, if a voltage, of which polarity is positive with respect to the cathode, is applied to the gate electrode G, the GTO is turned on. If a voltage, of which the polarity is negative with respect to the cathode, is applied to the gate electrode G, it is turned off.

FIG. 2 shows a structure of an insulating gate transistor as a second example of the conventional switching device. This transistor also has the PNPN structure, like the GTO. An anode electrode A is coupled with an anode emitter P1 through an ohmic contact. A cathode electrode K is also coupled with a cathode emitter N2 through an ohmic contact. A gate electrode G is formed over a base N1, a base P2 and the cathode emitter N2, with an insulating layer 2 formed therebetween. In operation of the switching device with such a structure, a plus voltage is applied to the anode electrode A and a minus voltage is applied to the cathode electrode K. Under this condition, if a voltage which is positive in polarity with respect to the cathode, is applied to the gate electrode G, an N channel is formed in the cathode base P2, resulting in turning on of the transistor. Then, if the voltage applied to the gate electrode G becomes zero, the N channel disappears and the transistor is turned off.

The conventional switching devices as mentioned above have the following disadvantages.

In the case of the first example of FIG. 1, the switching device is turned on in a current control manner in which current (gate current) is fed to the gate. This turn-on operation depends largely on majority and minority carriers, and further a spreading rate of plasma. In this respect, the turnoff characteristic of this device is not satisfactory.

In the case of the second example of FIG. 2, the switching device is turned on in a voltage control manner in which a channel is formed in the gate. Therefore, this device has a better turn-on characteristic than the conventional switching device of which the turn-on operation depends on the carrier diffusion. The switching device of the second example is turned off by erasing the channel, not by forcibly extracting carriers or holes from the gate, unlike the first example. Accordingly, a number of excess carriers are still left inside the switching device immediately after it is turned off. The excess carriers flow in the form of current (tail current) after it is turned off. This current deteriorates the turnoff characteristic.

Further, in the second example, to turn off the switching device, the application of the gate voltage is stopped. To keep the on-state of the device, voltage must be continuously applied to the gate. This means that when it is used as a self turnoff type switching device, only possible operation mode of the switching device is the transistor mode.

SUMMARY OF THE INVENTION

Accordingly, an object of the present invention is to provide a semiconductor switching device with good turn-on and turnoff characteristics.

To achieve the above object, there is provided a semiconductor switching device comprising a first semiconductor layer of first conductivity type, a second semiconductor layer of second conductivity type adjacent to the first layer, a third semiconductor layer of the first conductivity type adjacent to the second layer, a fourth semiconductor layer of the second conductivity type adjacent to the third layer, a first electrode electrically connected to the first layer, a second electrode electrically connected to the fourth layer, a first gate portion of the current control type, the first gate portion having a rectifying contact and being formed in an area of the third semiconductor layer, a second gate portion of the voltage control type formed in another area of the third layer, and a common gate terminal for coupling the first gate portion with the second gate portion, wherein when a voltage with a first polarity is applied to the common gate terminal, the switching device is turned on through the second gate portion, and when a voltage with a second polarity is applied to the common gate terminal, the switching device is turned off through the first gate portion.

DETAILED DESCRIPTION OF THE PREFERRED EMBODIMENTS

Some specific preferred embodiments of a semiconductor switching device according to the present invention will be described referring to the accompanying drawings.

Figure 3:
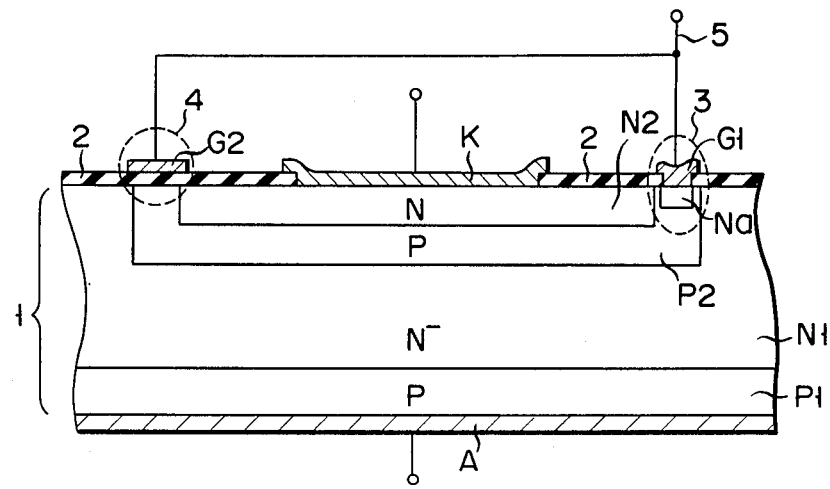
FIGS. 3 to 5 show respectively cross sectional views illustrating the structures of semiconductor switching devices which are embodiments of the present invention.

FIG. 3 shows a cross sectional view illustrating the structure of a first preferred embodiment of a semiconductor switching device according to the present invention.

As shown, the semiconductor switching device 1 contains a PNPN four-layered structure. Structurally, the device 1 includes a first semiconductor layer P1 of first conductivity type (P type), a second semiconductor layer N1 of second conductivity type (N type) adjacent to the first layer, a third semiconductor layer P2 of the P type adjacent to the second layer N1, and a fourth semiconductor layer N2 of N type adjacent to the third layer P2. Ends of the PN junction formed by the layers N1 and P2 and ends of the PN junction formed by the layers N2 and P2, are exposed at the main surface of the semiconductor device 1.

A first electrode (anode electrode) A is connected to the layer P1. A second electrode (cathode electrode) K is connected to a predetermined portion of the layer N2. An impurity area Na, formed by doping N type impurity thereto, is provided in a predetermined portion of the layer P2 facing the main surface of the device 1. A first gate 3 is formed by the PN junction formed between the impurity region Na and the layer P2. An electrode G1 is connected to this impurity region Na. An insulating film 2 (SiO2) is entirely formed on the main surface of the semiconductor device 1 except for the portion thereof provided with the electrode G1 and the second electrode K. An electrode G2 is provided above a predetermined portion of the layer P2, one end portion thereof exposed to the main surface of the device 1 through the insulating film 2 interposed therebetween. The electrode G2, the insulating film 2 and the layer P2 constitute a second gate portion 4. The electrodes G1 and G2 are interconnected by a common gate terminal 5. In this case a reverse withstand voltage Vz of the first gate 3 is set larger than the $V_{TH}$ of the second gate 4.

For operating the semiconductor switching device thus structured, a plus voltage is applied to the first electrode A, while a minus voltage is applied to the second electrode K. Under this condition, a voltage (gate voltage), of which the polarity is positive with respect to the electrode K, is applied to the common gate terminal 5. Then, at the first gate portion 3, the PN junction is reversely biased, so that the gate portion 3 does not operate. At the second gate portion 4, an N channel connecting the layer N1 to the layer N2 is formed, so that the device 1 is turned on. When the on-current exceeds a predetermined value (latching current), the current flow continues even if the gate voltage applied to the gate terminal 5 is stopped (thyristor operation).

When a minus voltage is applied to the common gate terminal 5, the second gate 4 does not operate, but at the first gate portion 3, excess carriers are extracted from the first gate portion 3, through the PN junction in this portion 3. As a result, the semiconductor switch device 1 is turned off and no current flows between the first electrode A and the second electrode K. With this structure of the switching device 1, at the time of its turning off, the PN junction in the second gate section 4 is forwardly biased, allowing injection of minority carriers. To minimize this mionority carrier injection, it is necessary to considerably reduce the injection efficiency at the gate section 4.

The semiconductor switching device of the above-mentioned embodiment provides the following effects.

Figure 1:
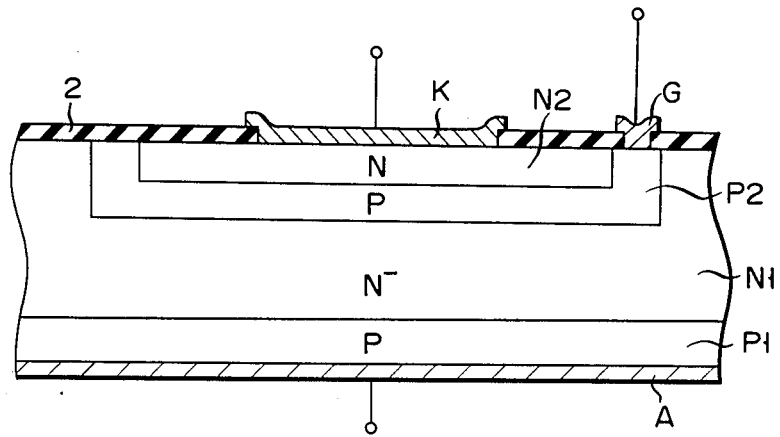
FIG. 1 shows a cross sectional view of a conventional gate turnoff thyristor.

(1) The switching device 1 is turned on at the gate portion 4 of the MOS structure in a voltage control manner. Therefore, the switching speed is faster than the first example device of FIG. 1.

(2) For turning off the device 1, excess carriers are directly extracted through the gate portion 3 having a rectifying junction, in a current control manner. Therefore, the tail current, which follows the turning off of the device 1, is small.

Figure 2:
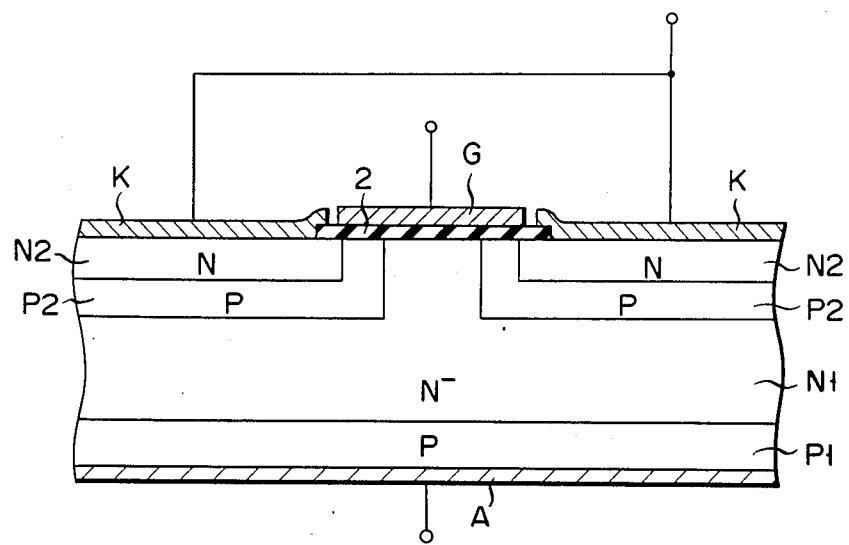
FIG. 2 shows a cross sectional view of a conventional insulating gate type transistor.

(3) In the second example of FIG. 2, when the current passing through the channel is increased above a predetermined value (latching current) by increasing the gate voltage, current also flows through the layer P2 other than the channel. As a result, even if the gate voltage is cut, the device is not turned off (latching). Thus, to turn on and off the switching device, the gate voltage must be within a voltage range in which the switching device is not latched. To maintain the turn-on state of the device, the voltage is continuously applied to the gate. Thus, the possible operation mode of the conventional switching device is only the transistor mode. On the other hand, in this embodiment, since the first gate 3 for the turnoff operation is provided, the switching device 1 is operable even in the latched mode. In other words, the switching device 1 of the present invention is operable in the thyristor mode in which the switching device 1 is kept in a turn-on mode even after the gate voltage is stopped.

(4) Although not referred to in the prior art description, it is possible to form a semiconductor device with a gate for turn-on and another gate for turnoff. In this device, however, a turn-on signal and a turnoff signal should be respectively applied to the gates, through separate signal routes. Therefore, this device requires two different gate control circuits respectively for the two gates, resulting in complicated circuit arrangement. On the other hand, in the switching device 1 of this embodiment, since the common gate terminal 5 is used, both the turn-on signal and the turnoff signal can be input through a single electrode. Therefore, that problem of the complicated circuit arrangement can be solved.

Figure 4:
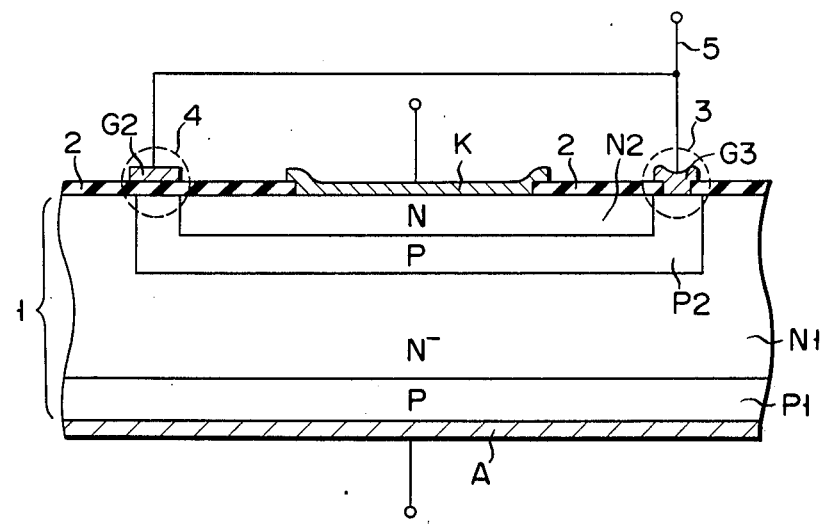

In FIG. 4, there is shown another embodiment of a semiconductor switching device according to this invention. As shown, the first gate portion 3 is comprised of a layer P2, a metal electrode G3 Schottky contacting with the layer P2, and a Schottky junction consisting of the layer P2 and the electrode G3. The construction and the operation of the embodiment of FIG. 4 is similar to that of FIG. 3, so that a further explanation thereof can be omitted here by applying like reference numerals.

Figure 5:
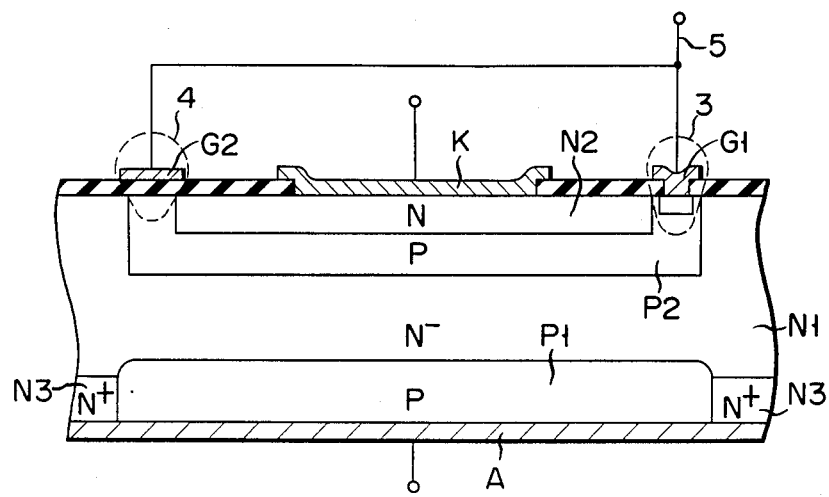

Yet another embodiment of the present invention is illustrated in FIG. 5. In this embodiment, an anode shortcircuiting portion N3 is additionally provided to the first semiconductor layer P1. Furthermore, to improve the turnoff characteristic, the doping of life time killer such as gold is allowed.

In the above-mentioned embodiments, the first and second conductivity types may be N type and P type conductivities, respectively. In this case, the bias voltage should be reversed in polarity.

Such a semiconductor switching device of this invention is very suitable as a high frequency switching device of high efficiency when it is used in a miniaturized switching power source.

Figure 6:
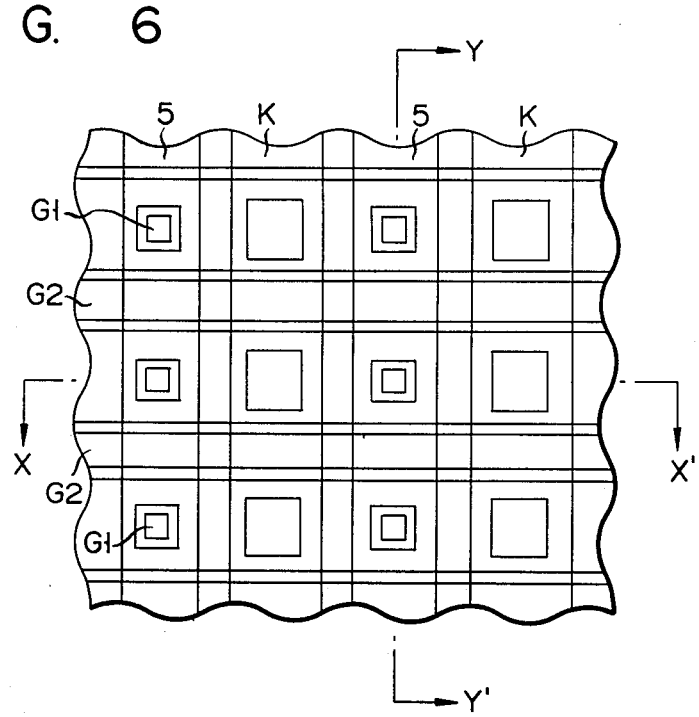
FIG. 6 shows a plan view of an area of a semiconductor chip on which the semiconductor switching devices as shown in FIGS. 1 to 3 are formed.
Figure 7:
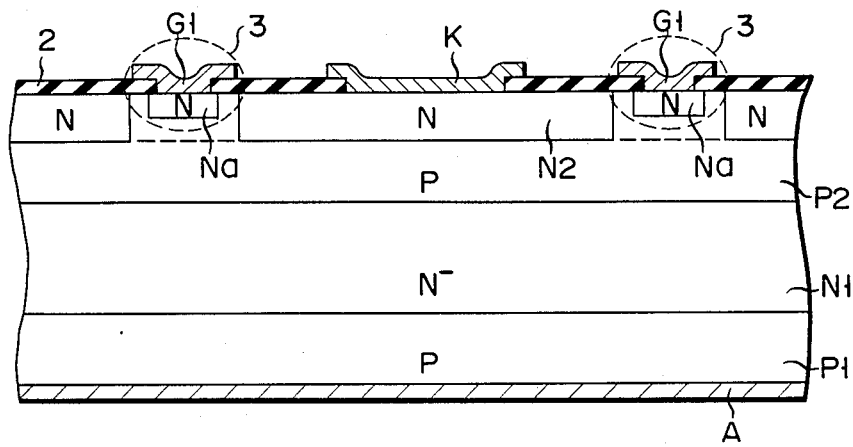
FIGS. 7 and 8 are sectional views of the devices as shown in FIG. 6.
Figure 8:
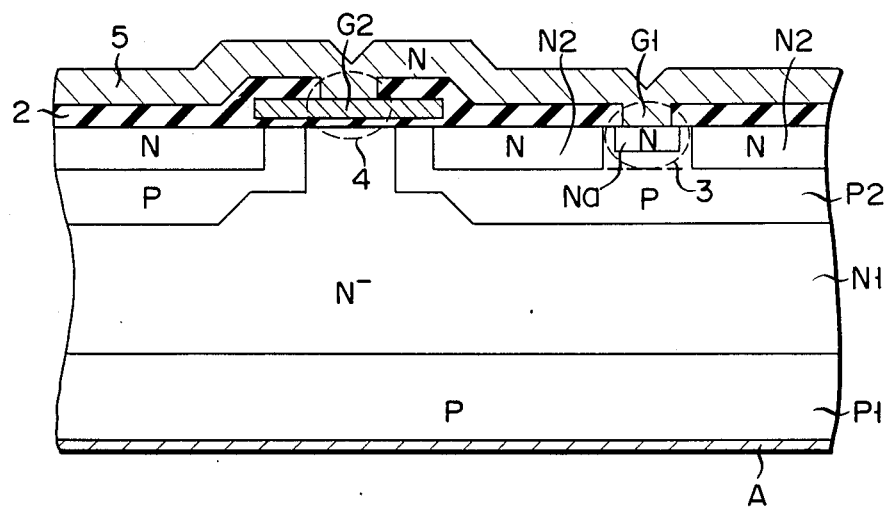

A plurality of semiconductor switching devices each having a structure as shown in FIG. 3 may be fabricated on a semiconductor chip as shown in FIGS. 6 to 8. As seen in FIG. 8, an aluminum layer 5 is formed on the insulating layer 2 to interconnect the first gate 3 and the second gate 4. As can be seen from FIG. 8, the aluminum layer 5 is also used as the gate electrode G1 of the first gate portion 3.

As seen from the foregoing description, the semiconductor switching device according to the present invention uses a single gate structure including first and second gate portions. Because of this feature, a single interconnection conductor provides a common path for both the turn-on signal and the turnoff signal. Further, with even the single gate structure, the switching device can be turned on and off by the voltage control manner and the current control manner, respectively. Therefore, good turn-on and turnoff characteristics can be obtained with a simple wiring.

What is claimed is:

1. A semiconductor switching device comprising:
    a first semiconductor layer of a first conductivity type;
    a second semiconductor layer of a second conductivity type adjacent to said first layer;
    a third semiconductor layer of the first conductivity type adjacent to said second layer such that a junction between said second and third semiconductor layers is partially exposed at an external surface;
    a fourth semiconductor layer of the second conductivity type adjacent to said third layer such that a junction between said third and fourth semiconductor layers is also partially exposed at said external surface;
    a first electrode electrically connected to said first layer;
    a second electrode electrically connected to said fourth layer;
    a first current control gate portion having a rectifying contact and being formed in an area of said third semiconductor layer, such that said first gate portion responds to a voltage of a first polarity for causing non-conduction of said device between said first and second electrodes and does not change the conduction of said device in response to a voltage of a second polarity;
    a second voltage control gate portion overlying said junctions between said second and third and between said third and fourth semiconductor layers in said external surface such that said second gate portion causes conduction between said first and second electrodes in response to a voltage of said second polarity and does not change the conduction of said device in response to a voltage of said first polarity; and
    a common gate terminal for coupling a control voltage signal to said first gate portion and said second gate portion.

2. The switching device according to claim 1, in which said first gate portion includes an impurity region with dopants of second conductivity type impurities in said third semiconductor layer, said third semiconductor layer and said impurity region thereby forming a PN junction.

3. The switching device according to claim 1, in which said rectifying contact includes an electrode made of a metal Schottky contacting with said third semiconductor layer.

4. The switching device according to claim 1, in which said second gate portion has a MOS structure including an insulation film formed on said external surface proximate said junctions at said surface and a conductive electrode formed on said insulation film over said third semiconductor layer.

* * * * *